United States Patent [19]

Kohno et al.

[11] Patent Number: 5,405,931
[45] Date of Patent: Apr. 11, 1995

[54] EPOXY RESIN COMPOSITIONS FOR USE IN ELECTRICAL LAMINATES

[75] Inventors: Masahiko Kohno, Susono; Takahiko Ohmura, Gotemba; Masanori Noba, Mishima, all of Japan

[73] Assignee: The Dow Chemical Company, Midland, Mich.

[21] Appl. No.: 106,168

[22] Filed: Aug. 13, 1993

Related U.S. Application Data

[63] Continuation of Ser. No. 862,006, Apr. 1, 1992, abandoned.

[30] Foreign Application Priority Data

Apr. 3, 1991 [JP] Japan ................................. 3-096146
Jul. 3, 1991 [JP] Japan ................................. 3-188361

[51] Int. Cl.⁶ .............................................. C08G 59/00
[52] U.S. Cl. ..................................... 528/102; 528/103; 525/507; 525/524
[58] Field of Search ................. 528/102, 103; 525/507, 525/524

[56] References Cited

U.S. PATENT DOCUMENTS

| | | | |
|---|---|---|---|
| 3,931,109 | 1/1976 | Martin | 525/507 |
| 4,186,036 | 1/1980 | Elms et al. | 525/396 |
| 4,251,594 | 2/1981 | Davis et al. | 428/413 |
| 4,608,406 | 8/1986 | Williams, Jr. et al. | 523/403 |
| 4,661,568 | 4/1987 | Koenig et al. | 525/510 |
| 4,710,429 | 12/1987 | Bogan et al. | 428/417 |
| 4,713,137 | 12/1987 | Sexton | 156/233 |
| 4,868,059 | 9/1989 | Walker et al. | 428/416 |
| 5,212,262 | 5/1993 | Anderson et al. | 525/527 |

*Primary Examiner*—Melvyn I. Marquis
*Assistant Examiner*—Randy Gulakowski

[57] ABSTRACT

Electrical laminates can be prepared from an epoxy resin composition which comprises:
(A) at least one epoxy resin having an average of more than one epoxy group per molecule;
(B) an oligomer having a terminal phenolic hydroxyl group, which oligomer results from the reaction of a glycidyl ether of a halogenated phenolic compound and a halogenated phenolic compound; and
(C) at least one catalyst for catalyzing a reaction between Component (A) and Component (B).

11 Claims, 2 Drawing Sheets

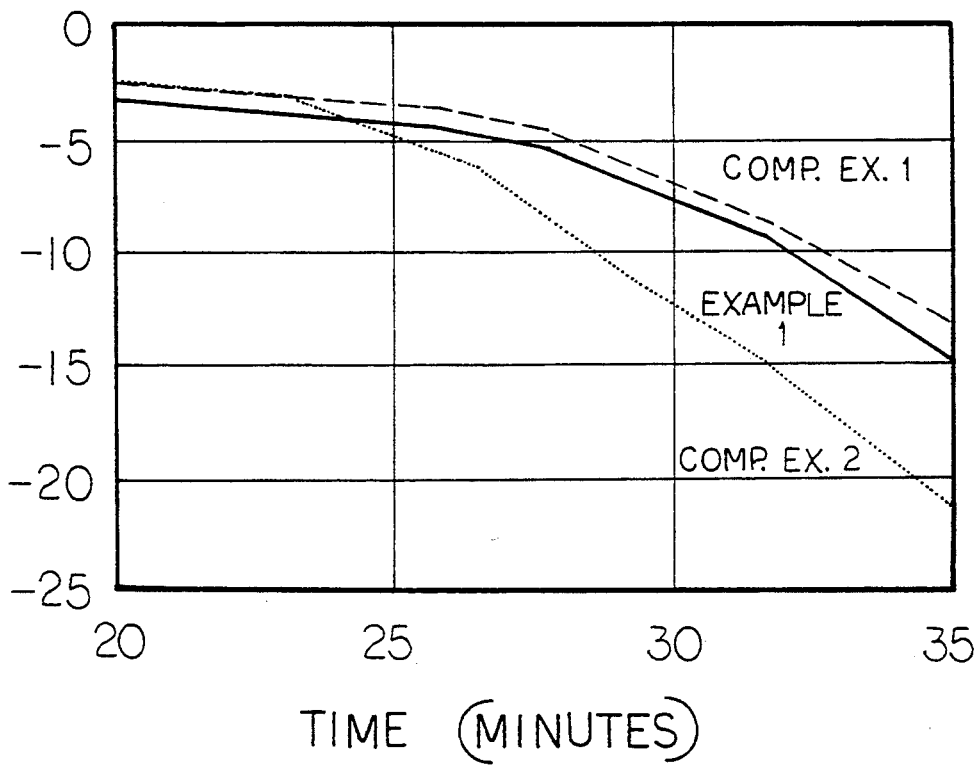

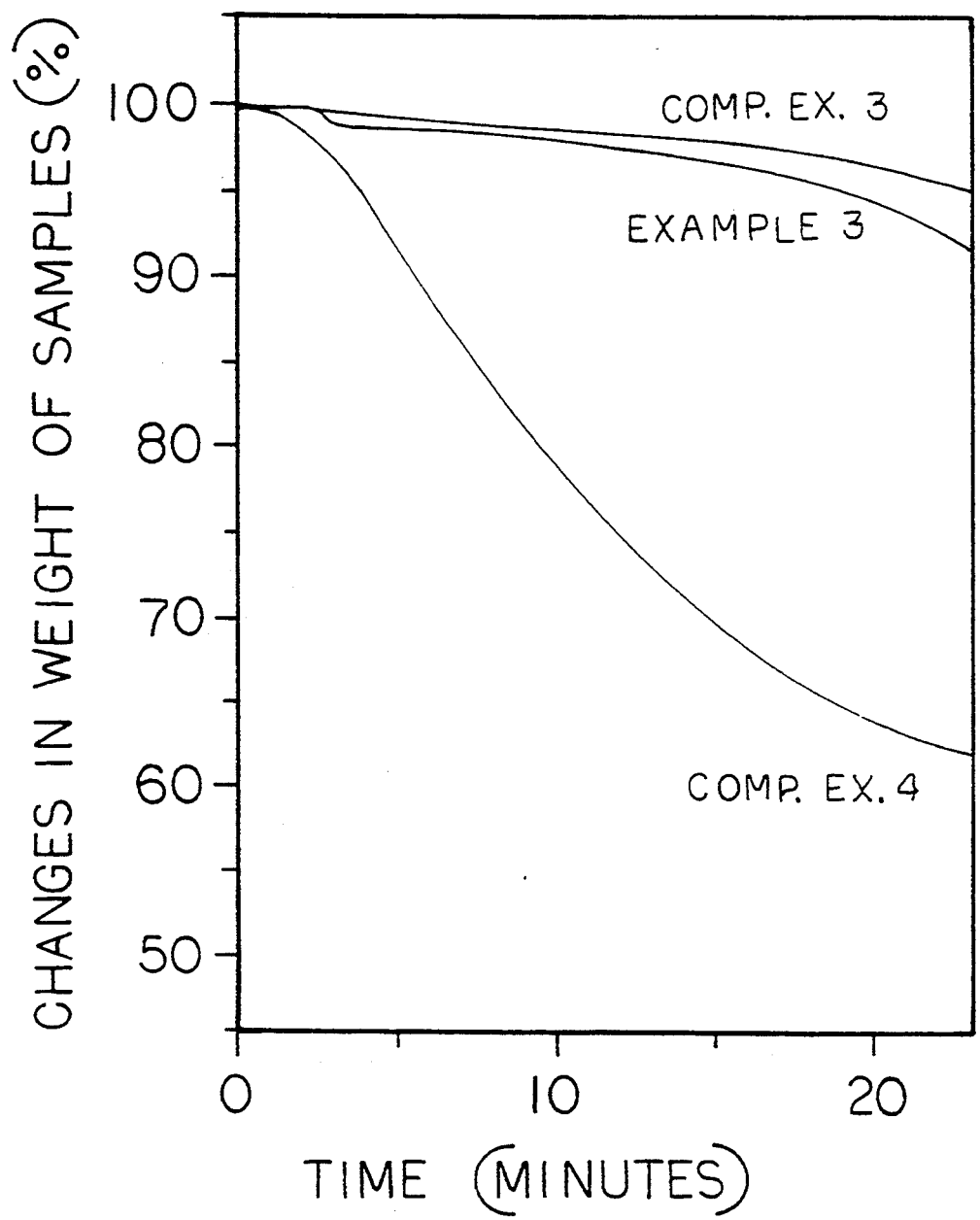

EPOXY RESIN COMPOSITIONS FOR USE IN ELECTRICAL LAMINATES

CROSS-REFERENCE TO RELATED APPLICATION

This is a continuation of application Ser. No. 07/862,006, filed Apr. 1, 1992, now abandoned.

BACKGROUND OF THE INVENTION

The present invention relates to an epoxy resin composition useful in preparation of an electrical laminate. More particularly, the present invention relates to an epoxy resin composition for use in preparation of an electrical laminate, which exhibits low viscosity when dissolved in an organic solvent, high glass transition temperature and good resistance to bromine release when cured.

Epoxy resins have been used as materials for electrical/electronics equipment, such as materials for electrical laminates because of their superiority in heat resistance, chemical resistance, insulation properties, dimensional stability, adhesiveness and the like.

Most electrical laminates are made from a varnish comprising a brominated epoxy resin prepared from the reaction of a certain amount of diglycidyl ether of bisphenol A (DGEBA) and a certain amount of tetrabromobisphenol A (TBBA), a curing agent and an accelerator dissolved in an organic solvent. In general, to provide sufficient flame retardancy, the brominated epoxy resins should have a bromine content of 20 to 23 weight percent. Thus, the conventional brominated epoxy resins are usually prepared by reacting 35 to 38 weight percent of tetrabromobisphenol A (TBBA) and 62 to 65 weight percent of a diglycidyl ether of bisphenol A (DGEBA).

To increase heat resistance of the resultant electrical laminates, it is preferable to use a brominated epoxy resin having low molecular weight. However, in the above TBBA/DGEBA system, it is difficult to control the molecular weight of the resultant brominated epoxy resin since the bromine content should be kept in the above ranges.

Accordingly, to improve heat resistance, approximately 15 parts by weight of a multifunctional epoxy resin such as a cresol epoxy novolac resin, are added to the TBBA/DGEBA system to prepare electrical laminates having a glass transition temperature of 135° C. However, the addition of the multifunctional epoxy resin disrupts the uniformity of reaction, leading to poor surface smoothness of the resulting prepreg. Attempts have been made to react the multifunctional epoxy resin with other components. However, this technique is disadvantageous since the resultant brominated epoxy resins have higher viscosity. Some multifunctional epoxy resins, having narrow molecular weight distribution, may not cause increases in viscosity. However, such resins are expensive and therefore not suitable for routine industrial use.

For ease of handling of an epoxy resin during preparation of prepreg, a solution containing the epoxy resin should preferably have lowest possible viscosity, but use the least possible amount of an organic solvent. However, as mentioned above, it is difficult to sufficiently decrease the viscosity of the conventional epoxy resin solutions or difficult to decrease the amount of the organic solvent employed.

As a method of decreasing molecular weight of the resultant brominated epoxy resins, without decreasing the bromine content, it is known to add a diglycidyl ether of TBBA to the conventional brominated epoxy resin prepared from the TBBA/DGEBA system. It is also known to supply a diglycidyl ether of TBBA to a reaction mixture of TBBA and DGEBA during the production of the conventional brominated epoxy resin so that a portion of the diglycidyl ether of TBBA reacts with the DGEBA and TBBA. Such techniques can reduce the molecular weight of the resultant brominated epoxy resin, leading to improved heat resistance and decrease in viscosity of the resin solution. However, these resins also have disadvantages since the bromine attached to the molecules of the epoxy resins is easily dissociated. Dissociated bromine remaining in a laminate results in poor adhesion to a conductive layer, which causes delamination or peeling from the layer.

In view of the deficiencies of the above-mentioned conventional epoxy resin compositions, it would be desirable to provide an epoxy resin composition useful in preparation of electrical laminates, which exhibits low viscosity when dissolved in an organic solvent, improved resistance to bromine release and improved heat resistance when cured.

SUMMARY OF THE INVENTION

According to the present invention, there is provided an epoxy resin composition useful in preparation of an electrical laminate, which comprises:

(A) at least one epoxy resin having an average of more than one epoxy group per molecule, which may be selected from (A-1) an epoxy resin having an average of more than one, but not more than two epoxy groups per molecule, (A-2) a multifunctional epoxy resin having an average of more than two epoxy groups per molecule, and (A-3) mixtures thereof;

(B) an oligomer having a terminal phenolic hydroxyl group, which results from the reaction of a glycidyl ether of a halogenated phenolic compound and a halogenated phenolic compound; and (C) at least one catalyst for catalyzing the reaction between the epoxy groups of Component (A) and the hydroxyl groups of Component (B).

Another aspect of the present invention relates to an electrical laminate prepared from the above-mentioned epoxy resin composition.

Still another aspect of the present invention relates to a process for preparing an electrical laminate which comprises the steps of (a) impregnating a substrate or web with the above-mentioned epoxy resin composition; (b) heating the thus prepared impregnated item ("prepreg"); (c) fabricating the prepreg into an electrical laminate by laminating one or more layers of the prepreg with an electrical conductive material; and (d) further heating the thus prepared laminate at elevated temperature and pressure to suitably melt and cure the epoxy resin in the laminate.

According to the present invention, use of an oligomer of a halogenated phenolic compound, which oligomer has a terminal phenolic group, makes possible preparation of an epoxy resin composition which exhibits low viscosity when dissolved in an organic solvent, good resistance to bromine release and good heat resistance when cured.

BRIEF DESCRIPTION OF THE DRAWINGS

FIG. 1 shows the results of the thermal weight analysis of the samples obtained in Example 1, and in Comparative Examples 1 and 2.

FIG. 2 shows the results of thermal weight analysis of the samples obtained in Example 3, and in Comparative Examples 3 and 4.

DETAILED DESCRIPTION OF THE INVENTION

In the present invention, Component (A), an epoxy resin having an average of more than one epoxy group per molecule, may be selected from (A-1) an epoxy resin having an average of more than one, but not more than two epoxy groups per molecule, (A-2) a multifunctional epoxy resin having an average of more than two epoxy groups per molecule, and (A-3) mixtures thereof. The exact selection of Component (A) is determined from the intended properties of the final products.

Component (A-1) comprises any known epoxy resins having an average of more than one, but not more than two epoxy groups per molecule. Suitable epoxy resins as used herein include, for example, those having an epoxy equivalent weight of about 170 to about 3,500, preferably about 170 to about 1,000, more preferably from about 170 to about 200. Such epoxy resins are well described in, for example, U.S. Pat. Nos. 4,251,594; 4,661,568; 4,710,429; 4,713,137; and 4,868,059, and "The Handbook of Epoxy Resins" by H. Lee and K. Neville, published in 1967 by McGraw-Hill, New York, all of which are incorporated herein by reference.

Epoxy resins which can be used as Component (A-1) in the present invention may be represented by the general formula (I):

wherein A is independently a divalent chemical bond, a divalent hydrocarbon group suitably having from 1 to about 10, preferably from 1 to about 5, more preferably from 1 to about 3 carbon atoms, —S—, —S—S—, —SO—, —SO$_2$—, —CO— or —O—; each R is independently a hydrogen atom or an alkyl group suitably having from 1 to about 3 carbon atoms; each X is independently a hydrogen atom or an alkyl group suitably having from 1 to about 10, preferably from 1 to about 5, more preferably from 1 to about 3 carbon atoms; n is a number of from 0 to about 10, preferably from 0 to about 6, more preferably from 0 to 3.

The above epoxy resins can be prepared by standard techniques from epichlorohydrin and a dihydric phenol. Preferred epoxy resins as Component (A-1) are those having two vicinal epoxy groups such as diglycidyl ethers of bisphenol A, bisphenol K, bisphenol F, bisphenol S, bisphenol AD and mixtures thereof. The most preferred epoxy resin is diglycidyl ether of bisphenol A. Commercially available epoxy resins such as D.E.R. 331L; D.E.R. 383J; D.E.R. 661; D.E.R. 664; D.E.R. 667; and D.E.R. 669 resins (D.E.R. is a Trademark of The Dow Chemical Company) available from The Dow Chemical Company, can be used.

To further improve heat resistance, the epoxy resin compositions of the present invention may further comprise a multi-functional epoxy resin having an average of more than two epoxy groups per molecule (Component (A-2)) in addition to Component (A-1).

Epoxy resins having an average of more than 2 vicinal epoxy groups per molecule (Component (A-2)) include, for example, those represented by the formulas (II) to (VI):

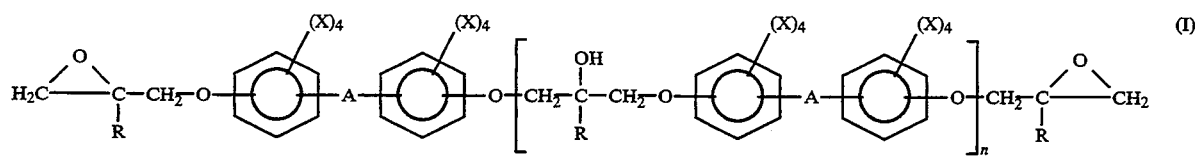

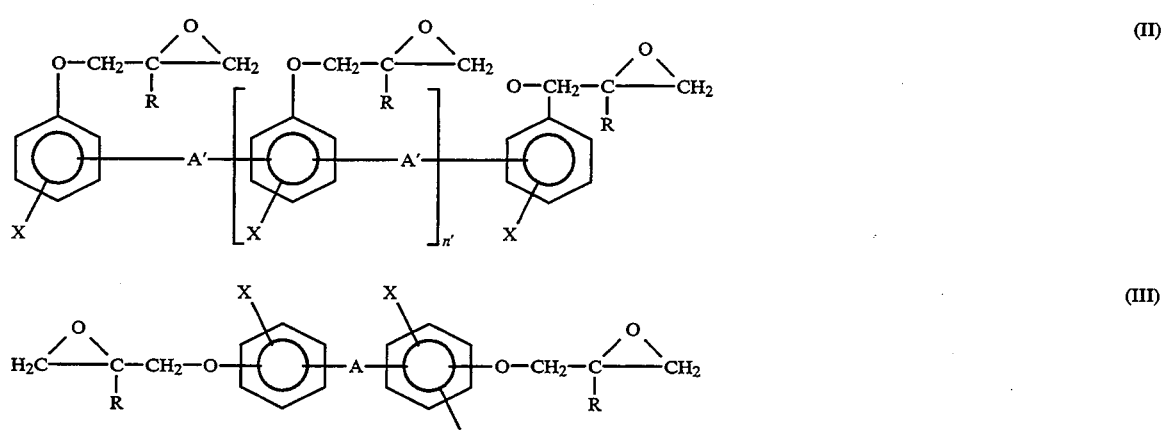

-continued
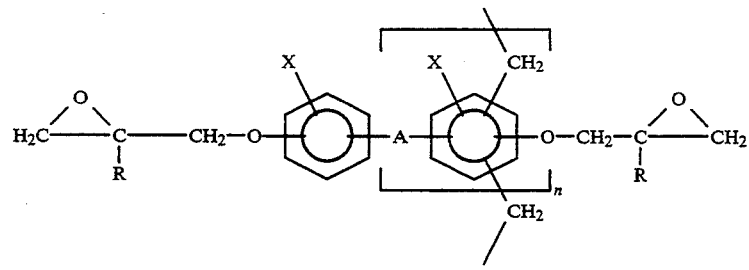
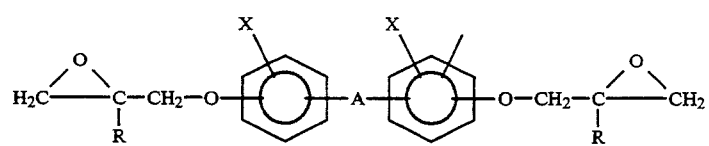
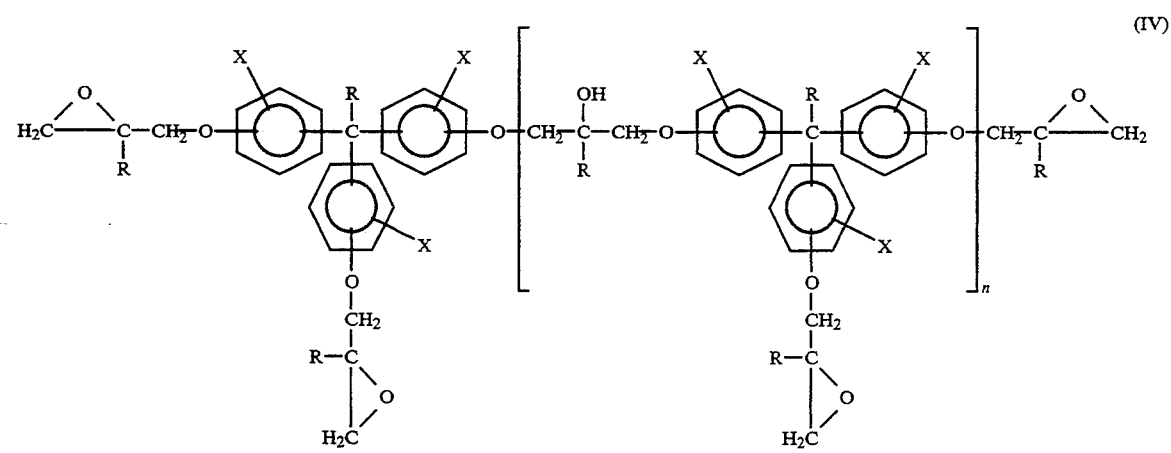
(IV)
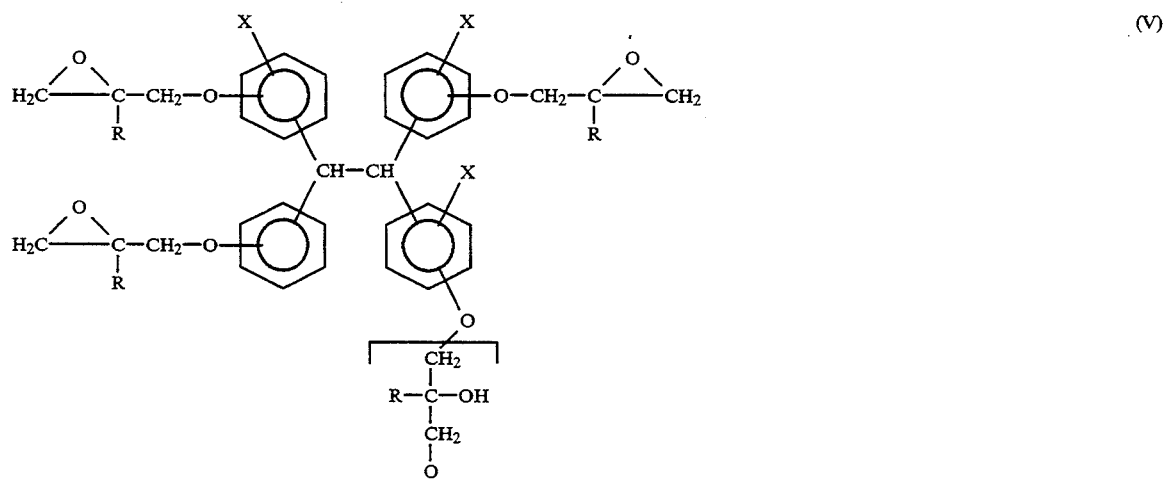
(V)

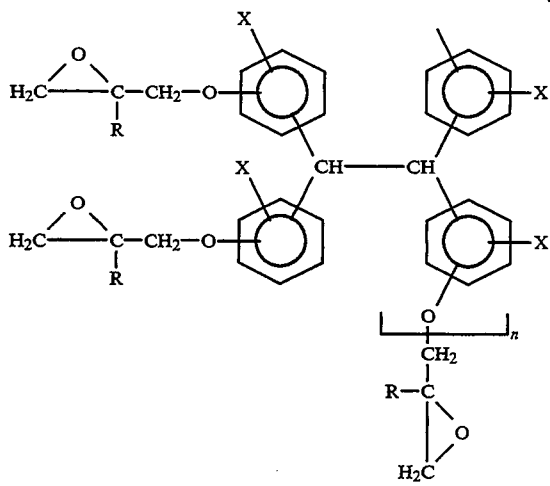

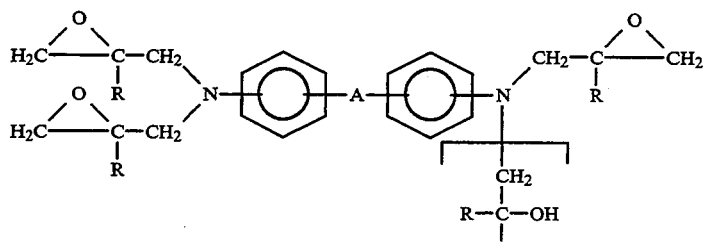

(VI)

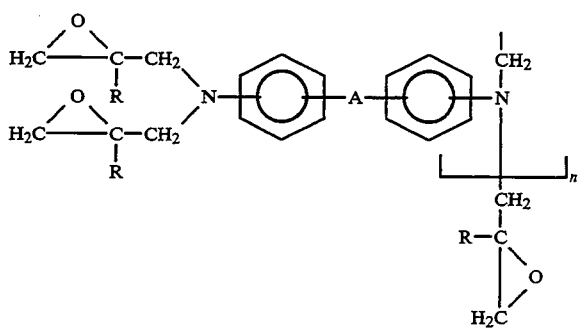

wherein A, R, X and n are as previously defined; A' is independently a divalent hydrocarbon group suitably having from 1 to about 10, preferably from 1 to about 5, more preferably from 1 to about 3 carbon atoms; n' is a number of from 1 to about 20, preferably from 1 to about 10, more preferably from 1 to about 6.

Among the above compounds, preferred Components (A-2) include, for example, a cresol-formaldehyde novolac epoxy resin, phenol-formaldehyde novolac epoxy resin, bisphenol A novolac epoxy resin, tris(glycidyloxyphenyl)methane, tetrakis(glycidyloxyphenyl)ethane, tetraglycidyldiaminodiphenylmethane and mixtures thereof. To prevent the resultant reaction product from having high viscosity, tris(glycidyloxyphenyl)methane, tetrakis(glycidyloxyphenyl)ethane and tetraglycidyldiaminodiphenylmethane are preferred. In view of cost performance, a cresol-formaldehyde novolac epoxy resin, phenol-formaldehyde novolac epoxy resin and bisphenol A novolac epoxy resin are preferred. In addition, it is preferable to use as Component (A-2) a multifunctional epoxy resin having narrow molecular weight distribution (e.g., a Mw/Mn value of 1.5 to 3.0).

The amount of Component (A) used may suitably range from about 30 to about 95 weight percent, preferably from 50 to 80 weight percent, more preferably from about 55 to 70 weight percent, based on the total weight of the composition. If the amount of Component (A) used is less than 30 weight percent, the resultant halogenated epoxy resin normally will have high molecular weight leading to increase in viscosity of the resin solution and the halogen content will be unnecessarily high. If the amount of Component (A) used exceeds 95 weight percent, the halogen content of the halogenated epoxy resin will be too low, leading to poor flame retardancy.

The ratio of a Component (A-1) to Component (A-2) may range suitably from 0:100 to 100:0, preferably from about 5:95 to 95:5, more preferably from about 50:50 to 95:5. The final products prepared from the resin composition comprising only Component (A-1) as epoxy component, will have sufficient heat resistance. However, to further improve heat resistance, Component (A-2) can be added. As the amount of Component (A-2) increases, the heat resistance of the cured product increases, but the viscosity of the resin solution also increases. Epoxy resin compositions, comprising only Component (A-2) as epoxy component, can be used for application requiring particularly high heat resistance. Such compositions may suitably have from about 30 to 95 weight percent, preferably from about 55 to about 75 weight percent of Component (A-2); from about 5 to about 70 weight percent, more preferably from about 25 to about 45 weight percent of Component (B); and from about 0.001 to about 1 weight percent of Component (C). Thus, the ratio of Component (A-1) to Component (A-2) should be determined depending upon the intended properties of the final products, taking into account the above-noted factors.

The epoxy resin compositions of the present invention comprise, as Component (B), an oligomer having a terminal phenolic hydroxyl group, which oligomer is obtained by reacting a glycidyl ether of a halogenated phenolic compound with a halogenated phenolic compound. Suitable oligomers which can be used in the present invention are those represented by the following Formula (VII):

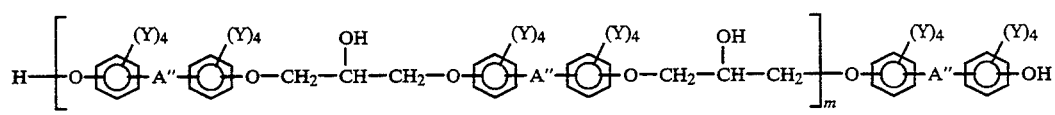

wherein A″ is independently a divalent hydrocarbon group suitably having from 1 to about 10, preferably from 1 to about 5, more preferably from 1 to about 3 carbon atoms, —S—, —S—S—, —SO—, —SO$_2$—, —CO— or —O—; each Y is independently a hydrogen atom, halogen atom or alkyl group suitably having from 1 to about 10, preferably from 1 to about 5, more preferably from 1 to about 3 carbon atoms, provided that at least one Y should be a halogen atom; m is a number of from 0.1 to about 13, preferably from 0.1 to about 10, more preferably from 1 to about 7.

These oligomers can be obtained by reacting excess amount of a halogenated phenolic compound such as TBBA with a glycidyl ether of a halogenated phenolic compound such as a diglycidyl ether of TBBA so that the resultant oligomer has terminal phenolic hydroxyl groups.

The reaction conditions for synthesizing such oligomers are widely variable. For example, a halogenated phenolic compound (Component (B-1)) and a glycidyl ether of a halogenated phenolic compound (Component (B-2)) are reacted in the presence or absence of a catalyst at a temperature of about 130° to about 200° C., preferably about 140° to about 180° C. for a period of about 0.3 to about 4 hours, preferably about 0.5 to about 1.5 hours. Component (B-1) and Component (B-2) may be used in amounts to provide a Component (B-1) to Component (B-2) ratio of from about 60:40 to 95:5, preferably from about 65:35 to 85:15.

Suitable Component (B-1) which can be used in the present invention includes dihydic phenols such as bisphenol A, bisphenol K, bisphenol F, bisphenol S, bisphenol AD and mixtures thereof. Suitable Component (B-2) include, for example, diglycidyl ethers of halogenated, preferably brominated, derivatives of the above phenols. The preferred Component (B-2) is an oligomer having a TBBA residue at the end of the molecule, which oligomer is prepared by reacting a diglycidyl ether of TBBA with TBBA.

In the present invention, Component (B) may be used in quantities of from about 5 to about 70 weight percent, preferably from about 15 to about 60 weight percent, more preferably from about 25 to about 45 weight percent, based on the total weight of the composition. If the amount of Component (B) added is less than 5 weight percent, sufficient flame retardancy normally cannot be obtained due to low halogen content of the halogenated epoxy resin. If the amount of Component (B) used is more than 70 weight percent, the resultant halogenated epoxy resin will have high molecular weight, leading to increase in viscosity of the resin solution and the halogen content will become unnecessarily high.

To obtain sufficient heat resistance, in the present invention, the kind and the amount of each component of the composition are selected in such manner that the halogen (preferably bromine) content of the final product ranges from about 15 to about 35, preferably from about 18 to about 23 weight percent.

The epoxy resin compositions of the present invention comprise, as Component (C), catalysts for catalyzing the reaction of the epoxy groups of Component (A) and the hydroxyl groups of Component (B). Such catalysts are described in, for example, U.S. Pat. Nos. 3,306,872; 3,341,580; 3,379,684; 3,477,990;, 3,547,881; 3,637,590; 3,843,605; 3,948,855; 3,956,237; 4,048,141; 4,093,650; 4,131,633; 4,132,706; 4,171,420; 4,177,216; 4,302,574; 4,320,222; 4,358,578; 4,366,295; and 4,389,520.

Examples of the suitable catalysts are imidazoles such as 2-methylimidazole; tertiary amines such as triethylamine, tripropylamine and tributylamine; phosphonium salts such as ethyltriphenylphosphonium chloride, ethyltriphenylphosphonium bromide and ethyltriphenyl-phosphonium acetate; and ammonium salts such as benzyltrimethylammonium chloride and benzyltrimethylammonium hydroxide. The amount of the catalysts used generally ranges from about 0.001 to about 1 weight percent, preferably from about 0.01 to about 0.1 weight percent, based on the total weight of the reaction mixture.

The epoxy resin composition of the present invention may comprise known curing agents. Such curing agents include, for example, amine curing agents such as dicyandiamide, diaminodiphenylmethane and diaminodiphenylsulfone; anhydrides such as hexahydroxyphthalic anhydride; imidazoles; and phenolic curing agents such as phenol novolac resins. Such curing agents can be added to the composition immediately before curing, or can be included in the compositon from the beginning if they are latent ones. The amount of the curing agents used may normally ranges from about 0.3 to about 1.0 equivalent per epoxy equivalent of the epoxy components.

To make handling of the compositions easier, a suitable organic solvent may be added since the above compositions are usually found in the solid form at standard conditions. Known organic solvents can be used. These include ketones such as acetone and methyl ethyl ketone; alcohols such as methanol and ethanol; glycol ethers such as ethylene glycol methyl ether and propylene glycol monomethyl ether; amides such as N,N-dimethylformamide; aromatic organic solvents such as toluene and xylene; aliphatic hydrocarbons; cyclic ethers; and halogenated hydrocarbons.

In the practice of the present invention, the amount of the organic solvent employed may range from about 10 to about 25 parts by weight, preferably from about 15 to about 20 parts by weight, based on 100 parts by weight of the above epoxy resin composition.

To improve storage stability, the epoxy resin compositions of the present invention may comprise a suitable stabilizer. The suitable stabilizers as used herein include, for example, alkylphenylsulfonates or halogenated alkylphenylsulfonates such as methyl-p-toluenesulfonate, ethyl-p-toluenesulfonate and methyl-p-chlorobenzenesulfonate. The most suitable stabilizer is methyl-p-toluenesulfonate. The stabilizer may suitably be used in an amount of about 0.001 to about 10 weight percent, more suitably about 0.01 to about 2 weight percent, based on the total amount of the composition.

As desired, the epoxy resin compositions of the present invention may comprise an effective amount of other commonly employed additives for epoxy resins, e.g., a reaction accelerator, pigment, dye, filler, surfactant, flow rate modifier, flame retardant and mixtures thereof.

A process for preparing an electrical laminate using the epoxy resin compositions of the present invention will be described below.

First, the above-mentioned epoxy resin composition of the present invention is incorporated with other necessary additives in appropriate amounts. The reaction mixture is reacted to obtain a halogenated epoxy resin. A multifunctional epoxy resin, Component (A-2) can be reacted simultaneously with Component (A-1) and Component (B) to introduce the structure of the multifunctional epoxy resin into the back born of the resultant epoxy resin. It is also possible to add Component (A-2) to a reaction product of Component (A-1) and Component (B).

The reaction conditions for the above reaction are not particularly limited. For example, the above mixture may be reacted at a temperature of from 130° to 200° C., preferably from about 140° to about 180° C., more preferably from about 145° to about 165° C. for a period of from about 0.2 to about 5 hours, preferably from about 0.3 to about 3 hours, more preferably from about 0.5 to about 1.5 hours. The halogenated epoxy resins so obtained may suitably have an epoxy equivalent weight of from about 250 to about 500, preferably from about 300 to about 450.

Then, the above-mentioned organic solvent, curing agent and other desired additives are mixed with the obtained halogenated epoxy resin to prepare an epoxy varnish. Then, the varnish is impregnated into a substrate or web. The obtained impregnated substrate is dried at, for example, about 80° to about 200° C., preferably about 100° to about 200° C. for about 0.5 to about 60 minutes, preferably about 0.5 to about 30 minutes to obtain epoxy based prepreg. As used herein, the substrates include, for example, glass cloth, a glass fiber, glass paper, paper, and similar substrates of polyethylene and polypropylene.

The obtained prepreg is cut into a desired size. A plurality of the cut prepregs (desired number, e.g., 2 to 10 pieces) are laminated and subjected to pressing at a pressure of, e.g., about 10 to about 50 Kg/cm$^2$, at about 130° to about 220° C. for about 0.5 to about 3 hours to obtain a laminate. An electrical conductive layer is formed on the laminate with an electrical conductive material. As used herein, suitable electrical conductive materials include electrical conductive metals such as copper, gold, silver, platinum and aluminum.

The electrical laminates manufactured as described above can be preferably used as copper clad laminates and multi-layer printed circuit boards for electrical or electronics equipment.

The present invention will be described in more detail with reference to the following Examples and Comparative Examples, which are not to be construed as limiting. Unless otherwise indicated, "part" means "part by weight".

EXAMPLE 1

A 2-liter flask was charged with 544 g (2 g-equivalent) of tetrabromobisphenol A (TBBA) and 333 g (1 g-equivalent) of a diglycidyl ether of TBBA. The reaction mixture was heated to 150° C. and stirred under nitrogen atmosphere, to obtain a transparent liquid. To the reaction mixture, 0.20 g of ethyltriphenylphosphonium acetate as catalyst was added. Then, the reaction was carried out in such a manner that the reaction temperature was elevated over a period of 30 minutes so as to limit the peak temperature to 170° C., then cooled to 150° C., and kept at 150° C. for 1 hour. As a result, an oligomer of TBBA having terminal phenolic hydroxyl groups, was obtained.

The TBBA oligomer obtained was placed in a steel tray coated with Teflon (Trademark of DuPont), cooled, and then ground to obtain pellets of a TBBA oligomer having terminal phenolic hydroxyl groups.

A 1-liter flask was charged with 187 g of those TBBA oligomer pellets and 318 g of a diglycidyl ether of bisphenol A (DGEBA). The reaction mixture was stirred and fused at 150° C. under nitrogen atmosphere. The product obtained was combined by blending with 0.11 g of ethyltriphenylphosphonium acetate as catalyst. Reaction between the TBBA oligomer and DGEBA was carried out in such a manner that the reaction temperature was elevated over a period of 30 minutes so as to limit the peak temperature to 170° C., then cooled to 150° C., and kept at 150° C. for 1 hour.

To the reaction product, 125 g of methyl ethyl ketone (MEK) were added to obtain a methyl ethyl ketone solution (solution viscosity of 360 cSt) containing the brominated epoxy resin which has a bromine content of 20.5 percent and an epoxy equivalent weight of 337.

To 125 parts of the thus obtained MEK solution of the brominated epoxy resin, 39 parts of a dicyandiamide (DICY) solution prepared by mixing DICY, dimethylformamide, propylene glycol methyl ether at a ratio of 1:5:5; and 2 parts of a 2-ethyl-4-methylimidazole (2E4MI) solution prepared by mixing 2E4MI and MEK at a ratio of 1:9, were added to prepare an epoxy varnish.

The resulting varnish was thinly coated on a stainless steel plate heated to 175° C., and kept for 1 hour to cure the coating.

The glass transition temperature of the cured product was measured with a differential scanning calorimeter (DSC 910 Type manufactured by DuPont) at a heat up rate of 10° C./min. Thermal weight analysis of the cured product obtained was measured with a thermal weight analyzer (TG-3C manufactured by Shimazu) at a prescribed fixed temperature. The results are as shown in Table 1 and FIG. 1.

EXAMPLE 2

The procedures of Example 1 were repeated except that 777 g (2.86 g-equivalent) of TBBA and 333 g (1 g-equivalent) of a diglycidyl ether of TBBA were used as starting materials, to obtain pellets of a TBBA oligomer having terminal phenolic hydroxyl groups.

Then, 185 g of the TBBA oligomer pellets obtained as above were reacted with 316 g of DGEBA in the same manner as in Example 1, to obtain a MEK solution with a viscosity of 670 cSt, containing a brominated epoxy resin having a bromine content of 20.5 percent and an epoxy equivalent weight of 360.

To 133 parts of the MEK solution of the brominated epoxy resin, 37 parts of the DICY solution and 2 parts of 2E4MI solution (same as used in Example 1) were added, and sufficiently stirred to obtain a varnish. The varnish was cured in the same manner as in Example 1 and the glass transition temperature was measured. The glass transition temperature of the cured product was 138° C. Other results are as shown in Table 1.

COMPARATIVE EXAMPLE 1

A 2-liter flask was charged with 175 g of TBBA and 326 g of DGEBA of TBBA. The reaction mixture was heated to 150° C. and stirred under nitrogen atmosphere, to obtain a transparent liquid. To the reaction mixture, 0.11 g of ethyltriphenylphosphonium acetate as catalyst were added. Then, the reaction was carried out in such a manner that the reaction temperature was elevated over a period of 30 minutes so as to limit the peak temperature to 170° C., then cooled to 150° C., and kept at 150° C. for 1 hour.

To the reaction product obtained, 125 g of MEK were added to obtain a MEK solution with a viscosity of 1330 cSt, containing a brominated epoxy resin having a bromine content of 20.5 percent and an epoxy equivalent weight of 447.

To 133 parts of the MEK solution of the brominated epoxy resin, 30 parts of the DICY solution and 2 parts of 2E4MI solution (same as used in Example 1) were added, and sufficiently stirred to obtain a varnish. The varnish was cured in the same manner as in Example 1 and the glass transition temperature was measured.

The glass transition temperature was 126° C. In addition, the thermal weight analysis of the cured product obtained was conducted. The results are as shown in Table 1 and FIG. 1.

COMPARATIVE EXAMPLE 2

The procedures of Comparative Example 1 were repeated except that 150 g of TBBA, 30 g of diglycidyl ether of TBBA and 320 g of DGEBA were used as starting materials, to obtain a MEK solution with a viscosity of 670 cSt, containing a brominated epoxy resin having a bromine content of 20.5 percent and an epoxy equivalent weight of 398.

To 133 parts of the MEK solution of the brominated epoxy resin, 33 parts of the DICY solution and 2 parts of 2E4MI solution (same as used in Example 1) were added, and sufficiently stirred to obtain a varnish. The varnish was cured in the same manner as in Example 1 and the glass transition temperature was measured.

The glass transition temperature was 136° C. In addition, thermal weight analysis of the cured product obtained was conducted. The results are as shown in Table 1 and FIG. 1.

TABLE 1

| | Example | | Comparative Example | |
|---|---|---|---|---|
| | 1 | 2 | 1 | 2 |
| Epoxy Eq.*1) | 337 | 360 | 450 | 398 |
| Viscosity (cSt)*2) | 360 | 670 | 1330 | 670 |
| Non-volatiles Content (%)*3) | 79.5 | 80.3 | 80.3 | 80.6 |
| Bromine Content (%)*4) | 20.5 | 20.5 | 20.5 | 20.5 |
| Tg (°C.)*5) | 140 | 138 | 126 | 136 |
| DGE of TBBA Content (wt. %)*6) | 14 | 11 | 0 | 5 |

Note:
*1) The epoxy equivalent of the brominated epoxy resins.
*2) The viscosity of the brominated epoxy resin solutions.
*3) The non-volatiles content of the resin solutions.
*4) The bromine content of the brominated epoxy resins.
*5) The glass transition temperature of the cured products.
*6) The content of the diglycidyl ether of TBBA incorporated in the brominated epoxy resins.

As apparent from the results shown in Table 1, the epoxy resin solutions obtained in Examples 1 and 2 exhibited lower viscosity than the conventional brominated epoxy resin used in Comparative Example 1. The cured products obtained in Examples 1 and 2 exhibited higher glass transition temperature than the conventional brominated epoxy resin used in Comparative Example 1.

Further, the epoxy resin solutions obtained in Examples 1 and 2 exhibited lower or equivalent viscosity to that obtained in Comparative Example 2, although the heat resistance of those of Examples 1 and 2 are the same or a little higher than that obtained in Comparative Example 2. As apparent from FIG. 1, it was confirmed that the cured product obtained in Comprarative Example 2 released more bormine than that obtained in Example 1 during heat treatment.

EXAMPLE 3

A 2-liter flask was charged with 800 g of TBBA and 200 g of a diglycidyl ether of TBBA. The reaction mixture was heated to 150° C. and stirred under nitrogen atmosphere, to obtain a transparent liquid. To the reaction mixture, 0.20 g of ethyltriphenylphosphonium acetate was added as catalyst. Then, the reaction was carried out in such a manner that the reaction temperature was elevated over a period of 30 minutes so as to limit the peak temperature to 170° C., then cooled to 150° C., and kept at 150° C. for 1 hour. As a result, an oligomer of TBBA having terminal phenolic hydroxyl groups, was obtained.

The TBBA oligomer obtained was placed in a steel tray coated with Teflon (Trademark of DuPont), cooled, and then ground to obtain pellets of a TBBA oligomer having terminal phenolic hydroxyl groups.

Thereafter, a 1-liter separable flask was charged with 163 g of the TBBA oligomer pellets, 262 g of DGEBA and 75 g of a cresol epoxy novolac resin (QUARTREX 3410; Trademark of The Dow Chemical Company; Manufactured by the same company). The reaction mixture was stirred and fused at 150° C. under nitrogen atmosphere. The product obtained was blended with 0.11 g of ethyltriphenylphosphonium acetate as catalyst. Then, the reaction was carried out in such a manner that the reaction temperature was elevated over a period of 30 minutes so as to limit the peak temperature to 170° C., then cooled to 150° C., and kept at 150° C. for 1 hour.

Then, 125 g of MEK was added to the reaction product to obtain a MEK solution with a viscosity of 1170 cSt, containing a brominated epoxy resin having a bromine content of 18.5 percent and an epoxy equivalent weight of 351.

To 125 parts of the thus obtained MEK solution, 38 parts of DICY solution prepared by mixing DICY, dimethylformamide, propylene glycol methyl ether at a ratio of 1:5:5; and 2 parts of a 2-ethyl-4-methylimidazole (2E4MI) solution prepared by mixing 2E4MI and MEK at a ratio of 1:9, were added to prepare an epoxy varnish.

The resulting varnish was thinly coated on a stainless steel plate heated to 175° C. and kept for 1 hour to cure the coating.

The glass transition temperature of the cured product was measured with a differential scanning calorimeter (DSC 910 Type manufactured by DuPont) at a heat up rate of 10° C./min.

The glass transition temperature of the cured product was 158° C. Thermal weight analysis of the cured product was measured with a thermal weight analyzer (951TGA; Manufactured by TA Instrument) at a prescribed fixed temperature. The results are as shown in Table 2 and FIG. 2.

EXAMPLE 4

The procedures of Example 3 were repeated except that 163 g of TBBA oligomer pellets, 262 g of DGEBA and 75 g of a glycidyl ether of trisphenol (TACTIX 742; Trademark of The Dow Chemical Company) were used as starting materials, to obtain a MEK solution with a viscosity of 960 cSt, containing a brominated epoxy resin having a bromine content of 18.5 percent and an epoxy equivalent weight of 331.

To 125 parts of the MEK solution, 40 parts of the DICY solution and 2 parts of 2E4MI solution (same as used in Example 3) were added, and sufficiently stirred to obtain a varnish. The varnish was cured in the same manner as in Example 3 and the glass transition temperature was measured. The glass transition temperature was 164° C. The other results are as shown in Table 2.

COMPARATIVE EXAMPLE 3

A 1-liter flask was charged with 158 g of TBBA and 343 g of DGEBA. The reaction mixture was heated to 150° C. and stirred under nitrogen atmosphere, to obtain a transparent liquid. To the reaction mixture, 0.11 g of ethyltriphenylphosphonium acetate as catalyst were added. Then, the reaction was carried out in such a manner that the reaction temperature was elevated over a period of 30 minutes so as to limit the peak temperature to 170° C., then cooled to 150° C., and kept at 150° C. for 1 hour.

To the reaction product obtained, 125 g of MEK were added to obtain a MEK solution with a viscosity of 840 cSt, containing a brominated epoxy resin having a bromine content of 18.5 percent and an epoxy equivalent weight of 390.

To 125 parts of the MEK solution, 34 parts of the DICY solution and 2 parts of 2E4MI solution (same as used in Example 3) were added, and sufficiently stirred to obtain a varnish. The varnish was cured in the same manner as in Example 3 and the glass transition temperature was measured.

The glass transition temperature was 125° C. In addition, the thermal weight analysis of the cured product obtained was conducted. The results are as shown in Table 2 and FIG. 2.

COMPARATIVE EXAMPLE 4

The procedures of Comparative Example 3 were repeated except that 133 g of TBBA, 30 g of diglycidyl ether of TBBA and 337 g of DGEBA were used as starting materials, to obtain a MEK solution with a viscosity of 370 cSt, containing a brominated epoxy resin having a bromine content of 18.5 percent and an epoxy equivalent weight of 353.

To 125 parts of the MEK solution of the brominated epoxy resin, 39 parts of the DICY solution and 2 parts of 2E4MI solution (same as used in Example 3) were added, and sufficiently stirred to obtain a varnish. The varnish was cured in the same manner as in Example 3 and the glass transition temperature was measured.

The glass transition temperature was 141° C. In addition, the thermal weight analysis of the cured product obtained was conducted. The results are as shown in Table 2 and FIG. 2.

TABLE 2

|  | Example | | Comparative Example | |
| --- | --- | --- | --- | --- |
|  | 3 | 4 | 3 | 4 |
| Epoxy Eq.*1) | 351 | 331 | 390 | 353 |
| Viscosity (cSt)*2) | 1170 | 960 | 840 | 370 |
| Non-volatiles Content (%)*3) | 79.8 | 80.2 | 80.3 | 80.0 |
| Bromine Content (%)*4) | 18.5 | 18.5 | 18.5 | 18.5 |
| Tg (°C.)*5) | 158 | 164 | 135 | 141 |

Note:
*1) The epoxy equivalent of the brominated epoxy resins.
*2) The viscosity of the brominated epoxy resin solutions.
*3) The non-volatiles content of the resin solutions.
*4) The bromine content of the brominated epoxy resins.
*5) The glass transition temperature of the cured products.

As apparent from the results shown in Table 2, the cured products obtained in Examples 3 and 4 exhibited higher glass transition temperature (better heat resistance) than the brominated epoxy resin obtained in Comparative Examples 3 and 4.

As apparent from the results shown in FIG. 2, the conventional brominated epoxy resin having improved heat resistance (Comparative Example 4) exhibited drastic weight loss immediately after heating. Thus, it was confirmed that such conventional resins release great amounts of bromine at early stage of heat treatment. On the contrary to this, the epoxy resin of the present invention (Example 3) did not exhibit substantial weight loss at early stage of heat treatment. Thus, it was confirmed that the resins of the present invention release a small amount of bromine.

What is claimed is:

1. A laminating varnish containing the following components dissolved in a solvent:
   (1) a curable epoxy resin that contains about 15 to about 35 weight percent halogen, made by a process comprising the following steps:
      (a) reacting about 60 to about 95 equivalent percent halogenated dihydric phenol with about 40 to about 5 equivalent percent diglycidyl ether of a halogenated dihydric phenol to make an oligomer terminated by phenolic hydroxyl groups; and
      (b) reacting about 5 to about 70 parts by weight of the oligomer with about 95 to about 30 parts by weight of an non-halogenated epoxy resin that contains on average more than one epoxy group per molecule;

wherein the curable epoxy resin has an epoxy equivalent weight of about 250 to about 5001 and (2) a curing agent useful for curing epoxy resins selected from the group consisting of amine curing agents, anhydrides and novolac resins.

2. The laminating varnish according to claim 1, wherein the epoxy resin in Step (1)(b) contains a resin selected from diglycidyl ethers of bisphenol A, bisphenol K, bisphenol F, bisphenol S, bisphenol AD and mixtures thereof.

3. The laminating varnish according to claim 1, wherein the epoxy resin in Step (a) (b) contains a resin selected from a cresol-formaldehyde novolac epoxy resin, phenol-formaldehyde novolac epoxy resin, bisphenol A epoxy resin, tris(glycidyloxyphenol)methane, tetrakis(glycidyloxyphenol)ethane, tetraglycidyldiaminodiphenolmethane and mixtures thereof.

4. The laminating varnish according to claim 1, wherein the oligomer made in Step (1)(a) is represented by the following formula:

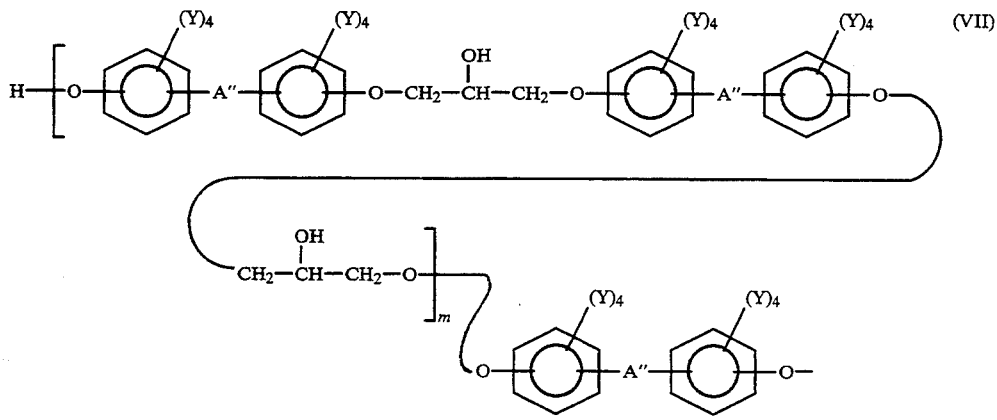

wherein A" is independently a divalent hydrocarbon group having from 1 to about 10 carbon atoms, —S—, —S—S—, —SO—, —SO$_2$—, —CO— or —O—; each Y is independently a hydrogen atom, a halogen atom or an alkyl group having from 1 to about 10 carbon atoms, provided that at least one Y is a halogen atom; m is a number of from 0.1 to 13.

5. An electrical laminate prepared from the laminating varnish of claim 1.

6. The laminating varnish of claim 1 wherein the solvent contains a ketone, an alcohol, a glycol ether, an aromatic or aliphatic hydrocarbon, a cyclic ether, or a halogenated hydrocarbon.

7. The laminating varnish of claim 1 which contains 10–25 parts solvent per 100 parts epoxy resin, by weight.

8. The laminating varnish of claim 1 wherein Component 1 contains 18–23 weight percent halogen.

9. The laminating varnish of claim 1 wherein Step (b) was carried out using 30-45 weight percent oligomer and 70-55 weight percent epoxy resin.

10. The laminating varnish of claim 1 wherein the epoxy resin in Step (1)(b) had an epoxy equivalent weight of about 170–200.

11. The laminating varnish of claim 1 wherein Component (1) has an epoxy equivalent weight of about 300–450.

* * * * *

UNITED STATES PATENT AND TRADEMARK OFFICE
CERTIFICATE OF CORRECTION

PATENT NO. : 5,405,931

DATED : April 11, 1995

INVENTOR(S) : Masahiko Kohno; Takahiko Ohmura; Masanori Noba

It is certified that error appears in the above-identified patent and that said Letters Patent is hereby corrected as shown below:

Claim 1, column 17, line 4, "5001" should correctly read - - 500; - -

Signed and Sealed this

Twenty-seventh Day of October, 1998

Attest:

BRUCE LEHMAN

*Attesting Officer*       *Commissioner of Patents and Trademarks*